(12) United States Patent
Higashiho

(10) Patent No.: US 7,035,156 B2
(45) Date of Patent: Apr. 25, 2006

(54) SEMICONDUCTOR MEMORY DEVICE CONTROL METHOD THEREOF, AND CONTROL METHOD OF SEMICONDUCTOR DEVICE

(75) Inventor: Mitsuhiro Higashiho, Beppu (JP)

(73) Assignee: Fujitsu Limited, Kawasaki (JP)

( * ) Notice: Subject to any disclaimer, the term of this patent is extended or adjusted under 35 U.S.C. 154(b) by 399 days.

(21) Appl. No.: 10/615,911

(22) Filed: Jul. 10, 2003

(65) Prior Publication Data
US 2004/0179415 A1 Sep. 16, 2004

Related U.S. Application Data

(62) Division of application No. 10/132,405, filed on Apr. 26, 2002, now Pat. No. 6,633,505.

(30) Foreign Application Priority Data

Nov. 7, 2001 (JP) ............................. 2001-342217

(51) Int. Cl.
*G11C 7/00* (2006.01)
(52) U.S. Cl. ...................................... 365/222; 365/229
(58) Field of Classification Search ................ 365/222, 365/229, 227, 149
See application file for complete search history.

(56) References Cited

U.S. PATENT DOCUMENTS 6,215,714 B1 * 4/2001 Takemae et al. ............. 365/222
6,324,113 B1 * 11/2001 Tomita ........................ 365/222

* cited by examiner

*Primary Examiner*—Anh Phung
(74) *Attorney, Agent, or Firm*—Arent Fox PLLC

(57) ABSTRACT

In a semiconductor memory device which has a plurality of operation modes and can reduce a consumed electric current by carrying out the switching control of an internal signal for every operation mode by required minimum control, a control method thereof, and a control method of a semiconductor device, there are provided an address switching circuit 13 for propagating either a refresh address ADD (Ref) from a refresh counter 14 at a time of a refresh mode or an external address ADD (R/W) at a time of data-input/output mode as internal address ADD (INT), a mode discriminating circuit 11 for discriminating between a refresh operation requesting signal REQ (Ref) and a data input/output requesting signal REQ (R/W) and for outputting a mode discriminating signal M, and a switch holding circuit 12 for outputting a switch change-over signal SW in accordance with the mode discriminating signal M, and the connection of the address switching circuit 13 is switched only at a time of a mode change.

2 Claims, 11 Drawing Sheets

SEMICONDUCTOR MEMORY DEVICE DIRECTED TO SECOND EMBODIMENT

SYSTEM STRUCTURE FOR REALIZING CONTROL METHOD DIRECTED TO FIRST EMBODIMENT

OPERATIONAL WAVEFORMS OF SYSTEM STRUCTURE DIRECTED TO FIRST EMBODIMENT

MODE DISCRIMINATING CIRCUIT

SWITCH HOLDING CIRCUIT

ADDRESS SWITCHING CIRCUIT

OPERATIONAL WAVEFORMS DIRECTED TO SECOND EMBODIMENT

SYSTEM STRUCTURE FOR REALIZING CONTROL METHOD DIRECTED TO THIRD EMBODIMENT

FLOW CHART SHOWING CONTROL METHOD DIRECTED TO THIRD EMBODIMENT

BLOCK DIAGRAM SHOWING MEMORY ARRAY STRUCTURE OF DRAM

SEMICONDUCTOR MEMORY DEVICE DIRECTED TO FOURTH EMBODIMENT

BLOCK DECODING CIRCUIT

OPERATIONAL WAVEFORMS DIRECTED TO FOURTH EMBODIMENT

CONVENTIONAL OPERATIONAL WAVEFORMS

SEMICONDUCTOR MEMORY DEVICE CONTROL METHOD THEREOF, AND CONTROL METHOD OF SEMICONDUCTOR DEVICE

This is a Division of application Ser. No. 10/132,405 filed Apr. 26, 2002, now U.S. Pat. No. 6,633,505 issued on Oct. 14, 2003. The disclosure of the prior application is hereby incorporated by reference herein in its entirety.

BACKGROUND OF THE INVENTION

1. Field of the Invention

The present invention relates to a semiconductor memory device which has a plurality of operation modes and can reduce a consumed electric current by carrying out the switching, control of internal signals required for the respective operation modes by required minimum control, a control method thereof, and a control method of a semiconductor device.

2. Description of Related Art

Conventionally, irrespective of synchronous type/asynchronous type, a semiconductor memory for memorizing data by storing an electric charge in a cell capacitor, such as a dynamic random access memory (hereinafter abbreviated to a DRAM), has a refresh operation mode in addition to an ordinary data-input/output operation mode. These operations have, as one unit, a so-called operation cycle in which on the basis of an external command etc., an access operation to a memory cell, such as an input/output operation of data or a refresh operation, is carried out from a stand-by state, and is again returned to the stand-by state. Setting of the operation mode has been carried out for every operation cycle to determine what access operation is to be carried out in each of the operation cycles.

In the refresh mode, it is necessary to repeatedly refresh all memory cells in the DRAM successively within a predetermined time. Then, it is common to continuously carry out the refresh operation in a period when the ordinary data-input/output mode is not in action. By a so-called self-refresh mode, in each cycle from the entry of a self-refresh command to the exit in the synchronous type DRAM, or in the set period of CAS before RAS in the asynchronous type DRAM, the refresh operation is successively carried out for the respective memory cells while an internal address is switched. Since the operation mode is fixed to the refresh mode in this period, the operation mode for each operation cycle is not confirmed, and direct transition of the address of the memory cell as an object to be refreshed is carried out without going through an intermediate state such as a reset of address content outputted from the internal address between the operation cycles.

In recent years, with the spread of portable equipment, the functions demanded for the equipment are increased, and consequently, instead of a conventionally mounted static random access memory (hereinafter abbreviated to an SRAM), a memory of further large capacity has been demanded. Then, a DRAM having a built-in refresh function, a so-called pseudo-SRAM has been used, which uses a highly integrated DRAM memory cell as compared with an SRAM memory cell and has a built-in control concerning the refresh operation peculiar to the DRAM memory cell, so that an external control circuit such as a refresh controller is made unnecessary and the external specification is equivalent to the SRAM.

The pseudo-SRAM is automatically shifted to the refresh mode at any time as the need arises, and can carry out the refresh operation. Thus, in both the refresh mode of the internal control and the ordinary data-input/output mode of the external control, the operation requests are made at arbitrary timings, and synchronization can not be established between both the operation modes. Accordingly, the pseudo-SRAM cannot adopt the continuous refresh operation in which the direct transition of the inner address is carried out without confirming the operation mode for each operation cycle, and differently from the normal DRAM, it is necessary to discriminate the operation mode for each operation cycle. Thus, it is necessary to switch the state of the internal address into a specified state for each operation cycle.

Specifically, for example, in the case where the ordinary data-input/output mode of the external control is set as the basic operation mode, each time the operation cycle of the refresh mode is ended, the setting of the internal address is switched to the external address required in the ordinary data-input/output mode. Besides, if such an architecture is adopted that an intermediate reset state is set between operation cycles, the internal address is switched to the reset state each time the operation cycle of the refresh mode is ended.

FIG. 15 shows operational waveforms expressing address switching for each operation cycle concerning the pseudo-SRAM in which the ordinary data-input/output mode is set as the basic operation mode. A period in which a refresh operation requesting signal REQ (Ref) is selected is an operation period Ref of a refresh mode, and a refresh address ADD (Ref) generated in an internal address counter or the like is propagated to an internal address ADD (Int). Besides, a period in which a data-input/output requesting signal REQ (R/W) is selected, is an operation period R/W of a data input/output mode in which read/write of data is carried out, and an external address ADD (R/W) inputted from the outside is propagated to the internal address ADD (Int).

Besides, in the operation periods Ref and R/W of the refresh mode and the ordinary data-input/output mode respectively, it is necessary to select a memory cell block as a unit of memory cell activation. Since the memory cells are arranged in a matrix form, as signals for selecting the memory cell block, the signals for selecting the respective directions of a row direction and a column direction are needed. One signal of those is a block selecting signal CBx (x=0 to n). The number of the memory cell blocks selected by this signal CBx (x=0 to n) becomes a less selection number at the time of the ordinary data-input/output mode in which the input/output of data from/to the outside exists and it is desired to perform an operation at a required minimum consumed electric current, as compared with the time of the refresh mode in which a refresh period is regulated from the data holding characteristic. In FIG. 15, at the time of the ordinary data-input/output mode, one block selecting signal CBa or CBb is activated. On the other hand, at the time of the refresh mode, all the block selecting signals CBx (x=0 to n) are activated.

In FIG. 15, since the ordinary data-input/output mode is made the basic operation mode, at the time of the end of the operation period Ref of the refresh mode, the settings of the internal address ADD (Int) and the cell block selecting signal CBx (x=0 to n) become the external address ADD (R/W) of the ordinary data-input/output mode and the cell block selecting signal CBa or CBb.

In the above, the pseudo-SRAM is used as an example, and the description has been given of, as an example, the case where the address is switched between the internal address and the external address for each of two different operation modes of the refresh mode of the internal control and the data-input/output mode of the external control. Also in other semiconductor devices, there is a case where switching of an internal state typified by address switching at every operation mode is carried out.

However, in the conventional pseudo-SRAM, even if a next operation cycle subsequent to the refresh mode is the ordinary data-input/output mode, as the internal address ADD (Int) in the stand-by period SBY between these, as indicated by a region (A) of FIG. 15, there is a fear that an address value (B1 or B2) of an unnecessary external address ADD (R/W) is set. At this time, the switching operation from the address value (A1 or A4) of the refresh address ADD (Ref) to the unnecessary address value (B1 or B2), and the switching operation from the unnecessary address value (B1 or B2) to the address value (B2 or B3) at the time of the ordinary data-input/output mode are unnecessary operations, and unnecessary electric current consumption is caused, which is problematic.

Such connection switching to the internal address ADD (Int) arises also in an operation state like a region (B) of FIG. 15 in which the refresh mode continues over a plurality of operation cycles. In this case, since the operation of the refresh mode continues as the operation in the pseudo-SRAM, the address value required as the internal address ADD (Int) is the address values A2 to A4 from the refresh address ADD (Ref). However, in the stand-by period SBY of the refresh mode, the address is switched to the address value B2 from the external address ADD (R/W), and the consumed electric current by the unnecessary operation resulting from this flows, which is problematic.

SUMMARY OF THE INVENTION

The invention has been made to solve the problems of the background art, and has an object to provide a semiconductor memory device which has a plurality of operation modes and can reduce a consumed electric current by carrying out the switching control of internal signals required for the respective operation modes by required minimum control, a control method thereof, and a control method of a semiconductor device.

In order to achieve the above object, a semiconductor memory device according to one aspect of the invention is a semiconductor memory device in which internal states at a time of carrying out an access operation to a memory cell have two or more different operation modes, and comprises a mode discriminating section for discriminating one of the operation modes at every operation cycle constituted by, as one unit, an operation period for carrying out the access operation and a stand-by period from an end of the operation period to a start of a next operation period, a switching section for switching among the internal states, and a switching control section for outputting a switching control signal to the switching section in accordance with a discrimination result obtained in the mode discriminating section, in which the switching control signal is not outputted in the stand-by period before a start of the operation cycle, but is outputted in the operation period subsequent to the start of the operation cycle.

In the semiconductor memory device, the mode discriminating section discriminates one of the operation modes in the operation cycle, and the switching control section outputs the switching control signal to the switching section for switching among the internal states in accordance with the discrimination result of the mode discriminating section. At this time, the switching control signal is not outputted in the stand-by period before the start of the operation cycle, but is outputted in the operation period subsequent to the start of the operation cycle.

By this, in accordance with the discrimination result of the operation mode, the switching control signal is outputted not in the stand-by period before the start of the operation cycle, but in the operation period subsequent to the start of the operation cycle, so that there does not occur such a state that the switching control signal is outputted before the operation cycle, and the switching control signal is further switched at the time of the start of the subsequent operation cycle or at the timing thereafter, and a suitable switching control signal is outputted at a suitable timing in accordance with the discrimination result. The output of an unnecessary switching control signal, switching of the signal, or the like is not caused, the switching section can be controlled by the output of the required minimum switching control signal, and the electric current consumption resulting from the signal switching can be suppressed to be minimum.

Besides, a semiconductor memory device according to another aspect of the invention is a semiconductor memory device having a data-input/output mode and a refresh mode as an access operation to a memory cell, and comprises a mode discriminating circuit for discriminating between the data-input/output mode and the refresh mode at every operation cycle constituted by, as one unit, an operation period for carrying out the access operation and a stand-by period from an end of the operation period to a start of a next operation period, a switching control circuit for outputting a switching control signal in the operation period after a start of the operation cycle only in a case where an operation mode discriminated by the mode discriminating circuit is different from an operation mode in the former operation cycle, and an address switching circuit for switching connection to a decoding circuit at every output of the switching control signal, while one of an external address used in the data-input/output mode and a refresh address used in the refresh mode from a refresh address counter is always connected to the decoding circuit.

In the semiconductor memory device, the mode discriminating circuit discriminates one of the operation modes in the operation cycle, and in accordance with the discrimination result of the mode discriminating circuit, the switching control circuit renews the switching control signal. The address switching circuit receiving the switching control signal connects either one of the external address or the refresh address to the decoding circuit. The switching control signal is not renewed in the stand-by period before the start of the operation cycle, but is renewed in the operation period subsequent to the start of the operation cycle.

Besides, a semiconductor memory device according to a third aspect of the invention is a semiconductor memory device having a data-input/output mode and a refresh mode as an access operation to a memory cell, and comprises a mode discriminating circuit for discriminating between the data-input/output mode and the refresh mode at every operation cycle constituted by, as one unit, an operation period for carrying out the access operation and a stand-by period from an end of the operation period to a start of a next operation period, a switching control circuit for outputting a switching control signal in the operation period after a start of the operation cycle only in a case where the operation mode discriminated by the mode discriminating circuit is different from the operation mode in the former operation cycle, and a block decoding circuit in which, when a memory cell array block to be accessed is specified, either a first number of bits with respect to address decoded in the data-input/output mode or a second number of bits with respect to address decoded in the refresh mode, smaller than the first number of bits, is always connected, and connection is switched at every output of the switching control signal alternately between the first number and the second number.

In the semiconductor memory device, the mode discriminating circuit discriminates one of the operation modes in the operation cycle, and in accordance with the discrimination result of the mode discriminating circuit, the switching control circuit renews the switching control signal. The block decoding circuit receiving the switching control signal switches and connects either one of the first bit number, or the second bit number. The switching control signal is not renewed in the stand-by period before the start of the operation cycle, but is renewed in the operation period subsequent to the start of the operation cycle.

By this, in accordance with the discrimination result of the operation mode, the switching control signal selecting either one of address supply paths or either one of the numbers of bits with respect to address for selecting activating sections of a memory cell array is renewed not in the stand-by period before the start of the operation cycle, but in the operation period after the start of the operation cycle, so that there does not occur such a state that the switching control signal is outputted before the operation cycle, and the switching control signal is further switched at the time of the start of the subsequent operation cycle or at the timing thereafter, and a suitable switching control signal is outputted at a suitable timing in accordance with the discrimination result. The output of an unnecessary switching control signal, switching of the signal, or the like is not caused, the switching section can be controlled by the output of the required minimum switching control signal, and the electric current consumption resulting from the signal switching can be suppressed to be minimum.

Besides, a control method of a semiconductor memory device according to one aspect of the invention is a control method of a semiconductor memory device in which address supply paths at a time of carrying out an access operation to a memory cell have two or more different operation modes, and comprises a mode discriminating process of discriminating one of the operation modes at every operation cycle constituted by, as one unit, an operation period for carrying out the access operation and a stand-by period from an end of the operation period to a start of a next operation period, and a switching control process of renewing a switching control signal selecting one of the address supply paths in accordance with a discrimination result of the mode discriminating process, not in a stand-by period before a start of the operation cycle, but in an operation period subsequent to the start of the operation cycle.

In the control method of the semiconductor memory device, the operation mode in the operation cycle is discriminated in the mode discriminating process, and the switching control signal selecting one of the address supply paths is renewed in the switching control process in accordance with the discrimination result of the mode discriminating process. At this time, the switching control signal is not renewed in the stand-by period before the start of the operation cycle, but is renewed in the operation period subsequent to the start of the operation cycle.

Besides, a control method of a semiconductor memory device according to another aspect of the invention is a control method of a semiconductor memory device in which activating sections of a memory cell array at a time of carrying out an access operation to a memory cell have two or more different operation modes, and comprises a mode discriminating process of discriminating one of the operation modes at every operation cycle constituted by, as one unit, an operation period for carrying out the access operation and a stand-by period from an end of the operation period to a start of a next operation period, and a switching control process of renewing a switching control signal selecting one of bit numbers of address of the activating sections in accordance with a discrimination result of the mode discriminating process, not in a stand-by period before a start of the operation cycle, but in the operation period subsequent to the start of the operation cycle.

In the control method of the semiconductor memory device, the operation mode in the operation cycle is discriminated in the mode discriminating process, and in accordance with the discrimination result of the mode discriminating process, the switching control signal selecting one of address bit numbers of the activating sections of the memory cell array is renewed in the switching control process. At this time, the switching control signal is not renewed in the stand-by period before the start of the operation cycle, but is renewed in the operation period subsequent to the start of the operation cycle.

By this, in accordance with the discrimination result of the operation mode, the switching control signal selecting one of the address supply parts or one of the bit numbers of the address for selecting the activating sections of the memory cell array is renewed not in the stand-by period before the start of the operation cycle, but in the operation period subsequent to the start of the operation cycle, so that there does not occur such a state that the switching control signal is outputted before the operation cycle, and the switching control signal is further switched at the time of the start of the subsequent operation cycle or at the timing thereafter, and a suitable switching control signal is outputted at a suitable timing in accordance with the discrimination result. The output of an unnecessary switching control signal, switching of the signal, or the like is not caused, the switching section can be controlled by the output of the required minimum switching control signal, and the electric current consumption resulting from the signal switching can be suppressed to be minimum.

Besides, a control method according to one aspect of the invention in which internal states at a time of carrying out an activating operation have two or more operation modes, comprises a mode discriminating process of discriminating one of the operation modes at every operation cycle constituted by, as one unit, an operation period for carrying out the activating operation and a stand-by period from an end of the operation period to a start of a next operation period, a mode recording process of storing one of the operation modes discriminated in the mode discriminating process, a comparison process of comparing one of the operation modes discriminated in the mode discriminating process with one of the operation modes of the former operation cycle stored in the mode recording process, and a switching control process of giving a switching-procedure instruction among the internal states in accordance with the comparison result in the comparison process, not in the stand-by period before a start of the operation cycle, but in the operation period subsequent to the start of the operation cycle.

In the control method, the operation mode of the operation cycle is discriminated in the mode discriminating process, the operation mode discriminated in the mode discriminating process is compared with the operation mode of the former operation cycle stored in the mode recording process, and the switching-procedure instruction among the internal states is given in accordance with the comparison result.

This instruction is not given in the stand-by period before the start of the operation cycle, but in the operation period subsequent to the start of the operation cycle.

By this, in accordance with the discrimination result of the operation mode, the switching-procedure instruction among the internal states is given not in the stand-by period before the start of the operation cycle, but in the operation period after the start of the operation cycle, so that there does not occur such a state that the switching-procedure instruction is given before the operation cycle, and the switching-procedure instruction is further switched at the time of the start of the subsequent operation cycle or at the timing thereafter, and a suitable instruction is carried out in accordance with the discrimination result. There does not occur an unnecessary switching-procedure instruction, the switching selecting one of the internal states can be controlled by the required minimum instruction, and the electric current consumption resulting from the signal switching can be suppressed to be minimum.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Hereinafter, first to fourth embodiments, which embody a semiconductor memory device of the invention, a control method thereof, and a control method of a semiconductor device, will be described in detail with reference to FIGS. 1 to 14.

Figure 1:
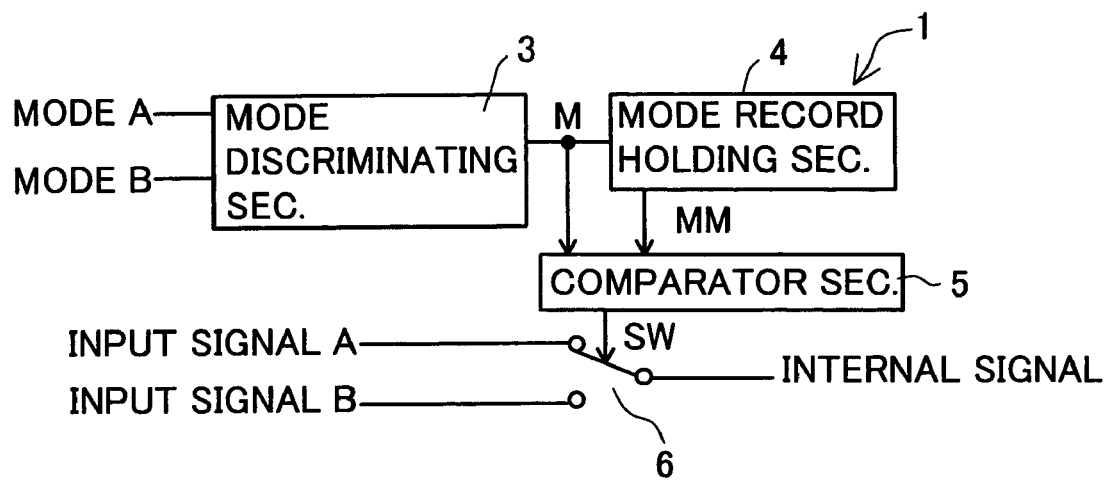
FIG. 1 is a block diagram showing a system configuration diagram for realizing a control method of a first embodiment.

In a system configuration diagram 1 for realizing a control method of a first embodiment shown in FIG. 1, each of modes A and B is an operation mode in an operation period interposed between stand-by periods. The system configuration diagram 1 includes a mode discriminating section 3 to which an instruction signal to suitably set one of the two operation modes is inputted at every operation cycle constituted by, as one unit, an operation period and a stand-by period, and a mode record holding section 4 for holding a mode discriminating signal M outputted from the mode discriminating section 3. Further, the mode discriminating signal M outputted from the mode discriminating section 3 and a mode discriminating signal MM of the former operation cycle held in the mode record holding section 4 are inputted to a comparator section 5, and a switch change-over signal SW is outputted as a comparison result. One of an input signal A and an input signal B is switched by a switch section 6 and is propagated to an internal signal. The switch change-over signal SW outputted from the comparator section 5 is inputted to the switch section 6.

In the system configuration diagram 1, the input signal propagated to the internal signal varies in every operation mode. The input signal A is propagated as the internal signal in the mode A, and the input signal B is propagated as the internal signal in the mode B. In the switch section 6, a terminal of the input signal A and a terminal of the internal signal, or a terminal of the input signal B and the terminal of the internal signal are always connected, and there does not occur such a state that the terminal of the internal signal is brought in an open state and the input signal becomes uncertain. This connection control is carried out by the mode discriminating section 3, the mode record holding section 4, and the comparator section 5.

In the operation cycle, the mode discriminating section 3 discriminates between inputted operation mode instruction signals of the modes A and B, and outputs the mode discriminating signal M. The mode discriminating signal M is inputted to the comparator section 5, and is compared with the mode discriminating signal MM of the former operation cycle held in the mode record holding section 4. As a result of the comparison, in the case where both the mode discriminating signals M and MM are different from each other, the switch change-over signal SW is outputted to change over the switch of the switch section 6, and the terminal of the input signal (input signal A or B) adapted to the selected operation mode (mode A or B) is connected to the terminal of the internal signal. Besides, as a result of the comparison, in the case where the operation modes are equal to each other, the switch change-over signal SW is not outputted, and the connection state of the switch section 6 maintains the state of the former operation cycle.

Here, the switch change-over signal SW can also be made a static signal for outputting a predetermined logical level to the switch section 6 in accordance with a connection direction. For example, such setting can be made that the high logical level is outputted in the case of connection with the terminal of the input signal A, and the low logical level is outputted in the case of connection with the terminal of the input signal B. Further, by the structure of the switch section 6, such configuration can also be adopted that the setting of the connection destination is controlled by pulse driving of the switch change-over signal SW, and after the setting, the connection state is held also after the end of the pulse signal of the switch change-over signal SW. In this case, the switch change-over signal has only to be pulse outputted only in the case where the operation mode is changed between the operation cycles, and in the case where the operation mode is not changed, it is not necessary to output the switch change-over signal SW, and the switch section 6 can maintain the connection state in the former operation cycle.

Figure 2:
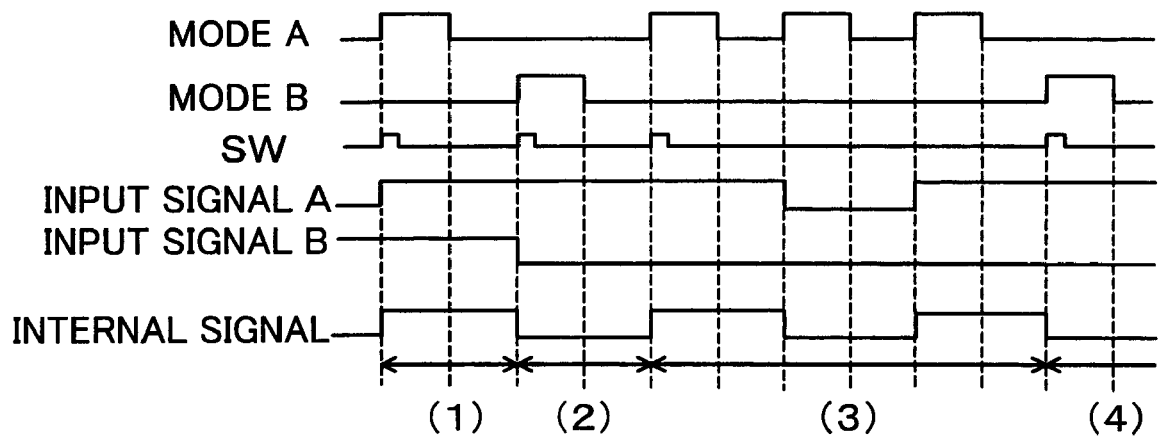
FIG. 2 shows operational waveforms expressing the operation of the system configuration diagram of the first embodiment.

FIG. 2 shows the state of switching of the switch section 6 according to the operation mode. A period in which an instruction signal of the mode A or the mode B is at the high logical level is an operation period, and in combination with a stand-by period in which both the signals are at the low logical level and an instruction of an operation mode is not given, an operation cycle is constituted. Here, the case where the switch section 6 is changed over by pulse driving of the switch change-over signal SW is shown. Now, it is assumed that the mode A is selected in an operation cycle next to an operation cycle in which the mode B is set, and the input signal A comes to have the high logical level. Since the operation mode is changed from the mode B to the mode A, the switch change-over signal SW is pulse driven through the comparison of the mode discriminating signals M and MM, the positive pulse signal is outputted to change over the switch section 6, and the input signal A of the high logical level is propagated as the internal signal. This connection state of the switch section 6 continues even if the operation period of the mode A is ended and the stand-by period takes place (in FIG. 2, (1)).

In the next operation cycle, the mode B is set. Since the operation mode is changed from the mode A to the mode B, the switch change-over signal SW is pulse driven through the comparison of the mode discriminating signals M and MM, the positive pulse signal is outputted to change over the switch section 6, and the input signal B of the low logical level is propagated as the internal signal. This connection state of the switch section 6 continues even when the operation period of the mode B is ended and the stand-by period takes place (In FIG. 2, (2)).

In the subsequent operation cycles of three cycles, the mode A is continuously set. In the first operation cycle, since the operation mode is changed from the mode B to the mode A, the switch change-over signal SW is pulse driven through the comparison of the mode discriminating signals M and MM, the positive pulse signal is outputted to change over the switch section 6, and the input signal A of the high logical level is inputted as the internal signal. This connection state of the switch section 6 continues also in the stand-by period. In the subsequent second and third operation cycles, since the operation mode of the mode A continues, the switch change-over signal SW is not pulse driven by the comparison of the mode discriminating signals M and MM. Since the positive pulse signal is not outputted from the switch change-over signal SW, the connection of the switch section 6 is not changed over, and the connection state is maintained between the terminal of the input signal A and the terminal of the internal signal. In this period, although the input signal A is changed from the low logical level to the high logical level in accordance with the operation cycle, since the connection state of the switch section 6 is maintained, the input signal A is propagated to the internal signal as it is (in FIG. 2, (3)).

In the subsequent operation cycle, the mode B is again set. Since the operation mode is changed from the mode A to the mode B, the switch change-over signal SW is pulse driven through the comparison of the mode discriminating signals M and MM, the positive pulse signal is outputted to change over the switch section 6, and the input signal B of the low logical level is propagated as the internal signal. This connection state of the switch section 6 continues even when the operation period of the mode B is ended and the stand-by period takes place (in FIG. 2, (4)).

According to the system configuration diagram 1 of the first embodiment as described above, in the operation cycle, in accordance with the mode discriminating signal M as the discrimination result as to whether the operation mode is the mode A or the mode B, the switch change-over signal SW is outputted not in the stand-by period before the start of the operation cycle, but in the operation period subsequent to the start of the operation cycle. Thus, there does not occur such a state that the switch change-over signal SW is outputted before the operation cycle, and the switch change-over signal SW is further outputted at the time of the start of the subsequent operation cycle or at the timing thereafter, and in accordance with the mode discriminating signal M, a suitable switch change-over signal SW is outputted at a suitable timing in accordance with the mode discriminating signal M. An unnecessary switch change-over signal SW is not outputted, switching control of the switch section 6 can be carried out by the output of the required minimum switch change-over signal SW, and the electric current consumption resulting from the signal switching can be suppressed to be minimum.

Besides, the mode discriminating signal MM in the former operation cycle is held in the mode record holding section 4, and the switch change-over signal SW is not renewed until the different mode discriminating signal M is outputted in the subsequent operation cycle and the comparison section 5 judges that both the mode discriminating signals M and MM are different from each other. The output of the unnecessary switch change-over signal SW can be suppressed, and the electric current consumption resulting from this can be suppressed to be minimum.

Besides, even if the switch change-over signal SW is not outputted, since the terminal of the input signal of one of the input signals A and B is always connected to the terminal of the internal signal in the switch section 6, the internal signal does not become uncertain.

Figure 3:
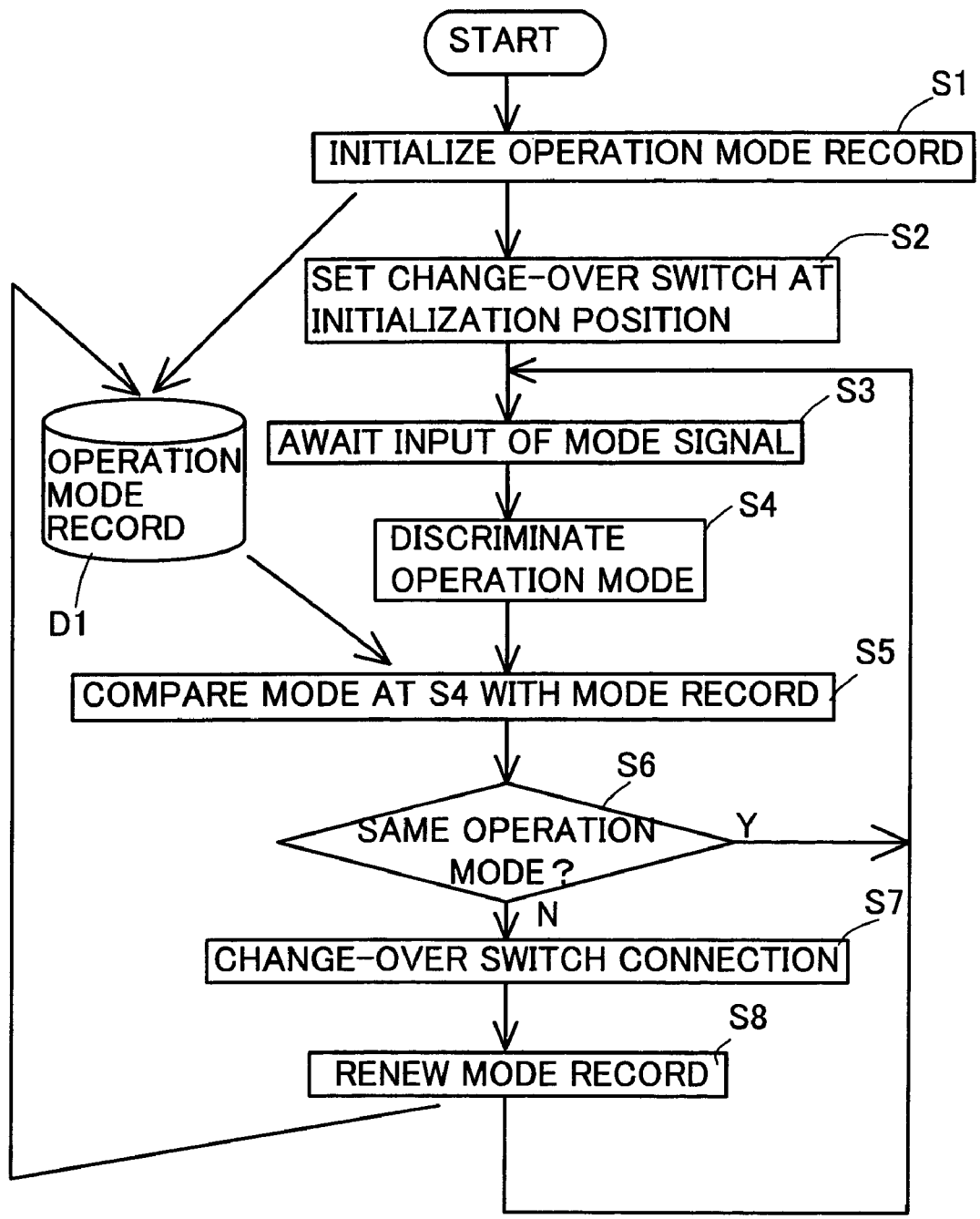
FIG. 3 is a flowchart showing the control method of the first embodiment.

Next, a flowchart of FIG. 3 will be described. FIG. 3 shows the flowchart as to the control method of the first embodiment. The flowchart shows the change-over control of the change-over switch according to the operation mode. At step (hereinafter abbreviated to S) 1, the operation mode record is initialized, and an operation mode record storing section D1 is initialized. In addition, a change-over switch is set to an initialization position (S2). In this state, the input of the operation mode signal is awaited (S3), and the operation mode is discriminated in accordance with the input (S4). The discrimination result is compared with the operation mode record stored in the operation mode record storing section D1 (S5), and if they are coincident with each other (S6: YES), the change-over control is not carried out, and the procedure returns to S3 and awaits the input of a next operation mode signal. In the case of inconsistence (S6: NO), the connection position of the change-over switch is shifted (S7), the content of the operation mode record storing section D1 is renewed (S8), and the procedure returns to S3.

According to the control method of the first embodiment as described above, the discrimination result of the operation mode discrimination (S4) is compared with the operation mode record of the former operation cycle stored in the operation mode record storing section D1 (S5), and the instruction of the suitable switching control is given in accordance with the result (S6). In the case where the comparison result indicates the coincidence (S6: YES), the switching control is not carried out, and the instruction of the unnecessary change-over control is not given. The change-over control is carried out only in the case where the comparison result indicates the inconsistence (S6: NO). Accordingly, the change-over control can be carried out by the required minimum instructions.

Besides, in the case where the same operation mode is set in a plurality of continuous operation cycles, the change-over control is carried out only in the first operation cycle in the plurality of operation cycles (S6: NO), and the switching control is not carried out in the subsequent operation cycle (S6: YES). After the change-over control is completed in the first operation cycle, the instructions of the unnecessary switching control can be suppressed.

The change-over control of the change-over switch is, for example, change-over of a supply source of the internal signal, and the change-over of the supply source of the internal signal can be carried out without carrying out the unnecessary switching control and by the required minimum control.

Figure 4:
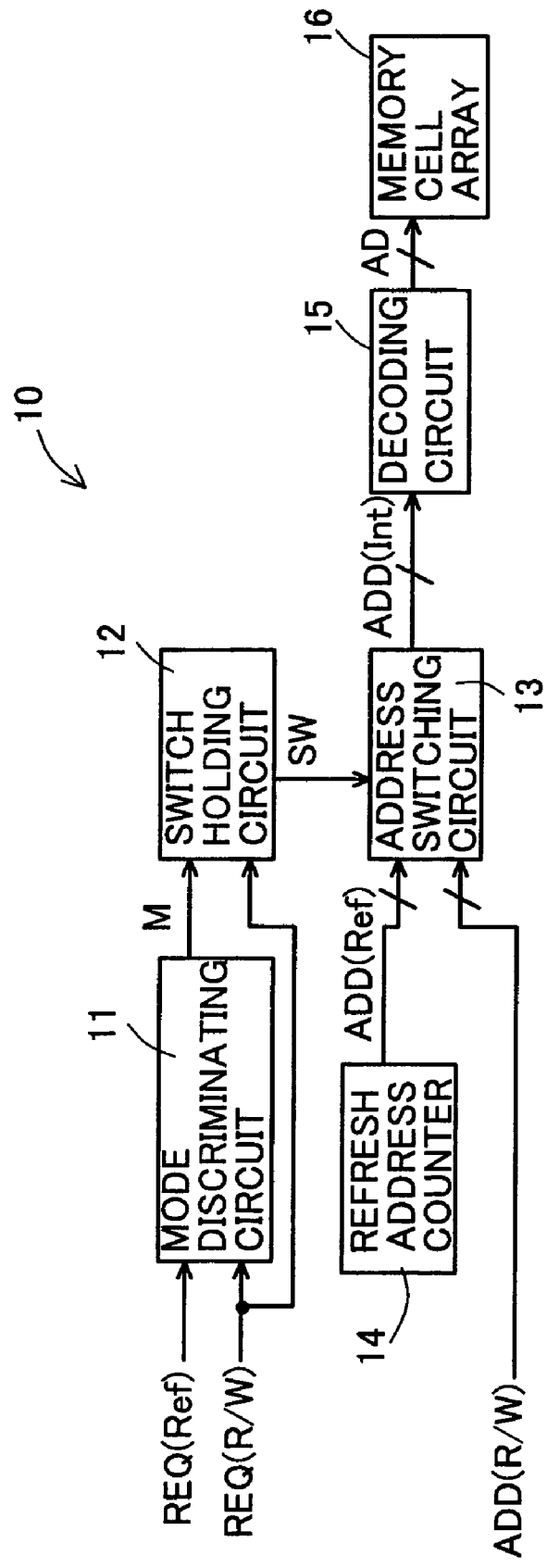
FIG. 4 is a block diagram showing a semiconductor memory device of a second embodiment.

Next, a description will be given of a case where a semiconductor memory device 10 of a second embodiment is applied to a pseudo-SRAM as a DRAM having a built-in refresh operation. This is an application example to an address switching control between two modes of an ordinary data-input/output mode and a refresh mode. In FIG. 4, there is provided an address switching circuit 13 to which a refresh address ADD (Ref) from a refresh address counter 14 for supplying an address at the time of a refresh mode and an external address ADD (R/W) inputted from the outside at the time of an ordinary data-input/output mode are inputted, and which propagates one of them to an internal address ADD (Int). The internal address ADD (Int) to which one of the refresh address ADD (Ref) and the external address ADD (R/W) is propagated, is inputted to a decoding circuit 15, and controls, as a decoding signal AD, a memory cell array 16.

Besides, there are provided a mode discriminating circuit 11 to which instruction signals of two operation modes, i.e., a refresh operation requesting signal REQ (Ref) and a data-input/output requesting signal REQ (R/W) are inputted, and a switch holding circuit 12 to which a mode discriminating signal M outputted from the mode discriminating circuit 11 and the data-input/output requesting signal REQ (R/W) are inputted. A switch change-over signal SW is outputted from the switch holding circuit 12 to the address switching circuit 13.

In the semiconductor memory device 10 of the second embodiment, a request signal to indicate whether an operation mode is the ordinary data-input/output mode or the refresh mode is discriminated by the mode discriminating circuit 11 at every operation cycle constituted by an operation period in which a predetermined memory cell is accessed to carry out the data-input/output operation or the refresh operation, and a stand-by period from an end of the access operation to a start of a next operation period. In the case of the ordinary data-input/output mode, the data-input/output mode requesting signal REF (R/W) is inputted, and in the case of the refresh mode, the refresh operation requesting signal REQ (Ref) is inputted, and the mode discriminating signal M is outputted as the discriminating signal to indicate which operation mode is set.

Figure 5:
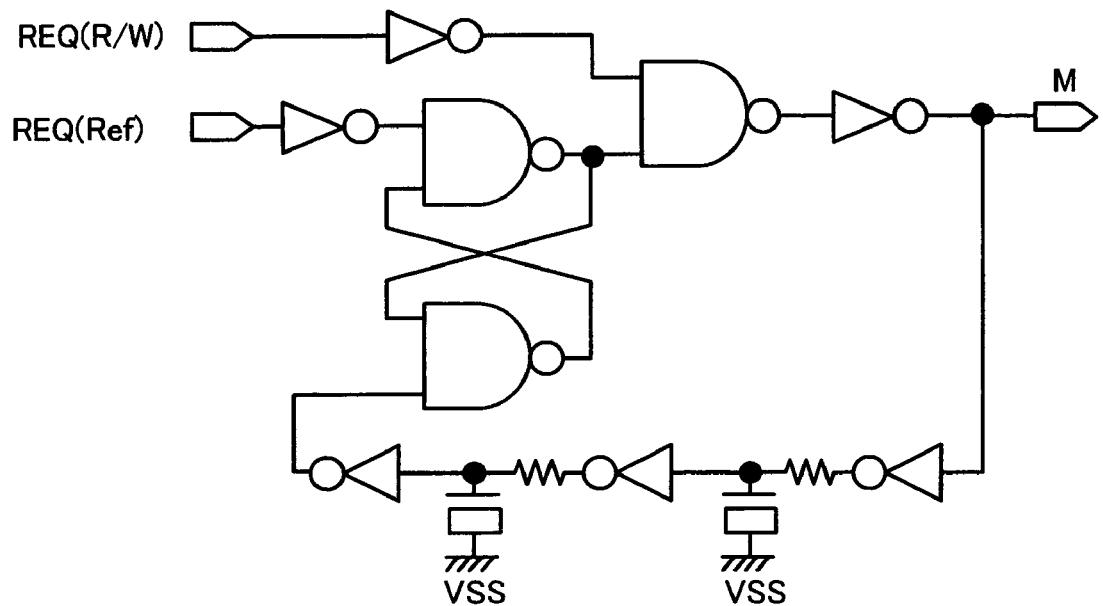
FIG. 5 is a circuit diagram showing a mode discriminating circuit in the semiconductor memory device of the second embodiment.

FIG. 5 shows a specific example of the mode discriminating circuit 11. The data-input/output requesting signal REQ (R/W) is inputted to one input terminal of a NAND gate through an inverter gate, is inverted by an inverter gate, and is outputted as the mode discriminating signal M. Accordingly, when the data-input/output requesting signal REQ (R/W) of a high logical level is inputted, the mode judgment signal M comes to have a low logical level, and the ordinary data-input/output mode is set as the operation mode. Even if the ordinary data-input/output mode is ended and the data-input/output requesting signal REQ (R/W) is inverted to the low logical level, if the refresh operation requesting signal REQ (Ref) is not inputted, at least one of the input terminals of the NAND gate is at the low logical level, and the low logical level is maintained as the mode discriminating signal M.

On the other hand, the refresh operation requesting signal REQ (Ref) is inputted to a set input terminal of a flip-flop circuit constituted by cross-coupled NAND gates, and then, it is inputted to the other input terminal of the NAND gate to which the data-input/output requesting signal REQ (R/W) is inputted, is inverted by the inverter gate, and is outputted as the mode discriminating signal M. The mode discriminating signal M is inputted to a reset input terminal of the flip-flop circuit through a three-stage inverter delay circuit including CR delay elements. Accordingly, when the refresh operation requesting signal REQ (Ref) of the high logical level is inputted, the flip-flop circuit is set and the high logical level is outputted. At this time, in the case where the data-input/output requesting signal REQ (R/W) is not inputted, both the input terminals of the NAND gate come to have the high logical level, so that the mode discriminating signal M comes to have the high logical level, and the refresh mode is set as the operation mode. The mode discriminating signals M of these cases are being set during the period in which the data-input/output requesting signal REQ (R/W) or the refresh operation requesting signal REQ (Ref) is set.

When the refresh mode is ended and the refresh operation requesting signal REQ (Ref) is inverted to the low logical level, the flip-flop circuit is reset after a delay time determined by the inverter delay circuit, so that the signal of the low logical level is outputted from the flip-flop circuit, and the mode discriminating signal M is inverted to the low logical level. That is, in the refresh mode, the mode discriminating signal M has the high logical level in the period when the refresh operation requesting signal REQ (Ref) of the high logical level is inputted, and only during the delay time determined by the inverter delay circuit from the end of the period, and the refresh mode is indicated.

In the case where the data-input/output requesting signal REQ (R/W) and the refresh operation requesting signal REQ (Ref) are inputted at the same time, the flip-flop circuit is set by the refresh requesting signal REF (Ref). However, since the one input terminal of the NAND gate is set at the low logical level by the data-input/output requesting signal REQ (R/W), the mode discriminating signal M comes to have the low logical level. That is, priority is given to the ordinary data-input/output mode and the operation mode is specified. Here, if the delay time by the inverter delay path is set to be long as compared with a high logical level duration time of the data-input/output requesting signal REQ (R/W), the output signal of the flip-flop circuit is in the set state during a period from the end of the data-input/output requesting signal REQ (R/W) to the reset by the delay signal from the inverter delay circuit, and as the mode discriminating signal M, the pulse signal of the high logical level is outputted, and the refresh mode is set.

The mode discriminating signal M outputted from the mode discriminating circuit 11, together with the data-input/output requesting signal REQ (R/W), is inputted to the switch holding circuit 12, and the switch change-over signal SW is outputted at every switching of the operation mode.

Figure 6:
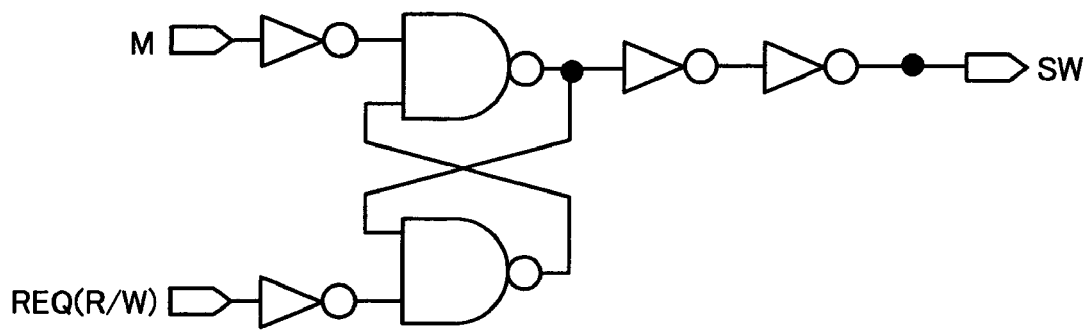
FIG. 6 is a circuit diagram showing a switch holding circuit in the semiconductor memory device of the second embodiment.

FIG. 6 shows specific example of the switch holding circuit 12. The mode discriminating signal M and the data-input/output requesting signal REQ (R/W) are respectively inputted to a set and a reset input terminals of a flip-flop circuit constituted by NAND gates through inverter gates. The output signal from the flip-flop circuit is outputted as the switch change-over signal SW through a two-stage inverter gate. Accordingly, if the mode discriminating signal M is set at the high logical level, the flip-flop circuit is set, and the switch change-over signal SW is set at the high logical level. In the case where the data-input/output requesting signal REQ (R/W) is set at the high logical level, the mode discriminating signal M of the high logical level is not outputted from the mode discriminating circuit 11, and the flip-flop circuit is reset so that the switch change-over signal SW is set at the low logical level. In the case where the same operation mode continues, since one of the set signal or the reset signal is inputted to the flip-flop circuit, the output signal is not inverted. Accordingly, the logical level of the switch change-over signal SW is not inverted in this period.

The switch change-over signal SW outputted from the switch holding circuit 12 is inputted to the address switching circuit 13, and in accordance with the logical level of the switch change-over signal SW, the connection of an address path is switched so that one of the refresh address ADD (Ref) outputted from the refresh address counter 14 or the external address ADD (R/W) inputted from the outside is propagated to the internal address ADD (Int).

Figure 7:
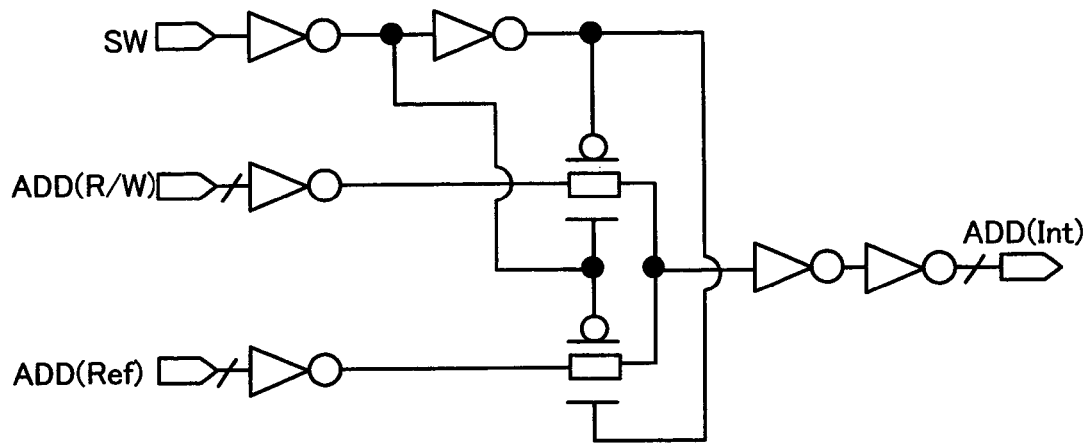
FIG. 7 is a circuit diagram showing an address switching circuit in the semiconductor memory device of the second embodiment.

FIG. 7 shows a specific example of the address switching circuit 13. An address path of the refresh address ADD (Ref) and an address path of the internal address ADD (Int), and an address path of the external address ADD (R/W) and the address path of the internal address ADD (Int) are respectively connected by transfer gates. A pair of complementary signals obtained from the switch change-over signal SW are inputted as control signals of the respective transfer gates. Since the respective paths are alternatively connected, the input relation of the control signals becomes a complementary relation between the transfer gates. That is, in the case where the refresh address ADD (Ref) and the internal address ADD (Int) are connected, the control is carried out so that the transfer gate is turned on in the case where the switch change-over signal SW is at the high logical level. In the case where the external address ADD (R/W) and the internal address ADD (Int) are connected, the control is carried out so that the transfer gate is turned on in the case where the switch change-over signal SW is at the low logical level.

Here, in the case where the same operation mode continues, since the logical level of the switch change-over signal SW is not changed, the connection state of the address switching circuit 13 is not also changed. In the period of the operation cycle in which the ordinary data-input/output mode continues, the internal address ADD (Int) maintains the state in which it is connected to the external address ADD (R/W), and in the period of the operation cycle in which the refresh mode continues, the internal address ADD (Int) maintains the state in which it is connected to the refresh address ADD (Ref).

Figure 8:
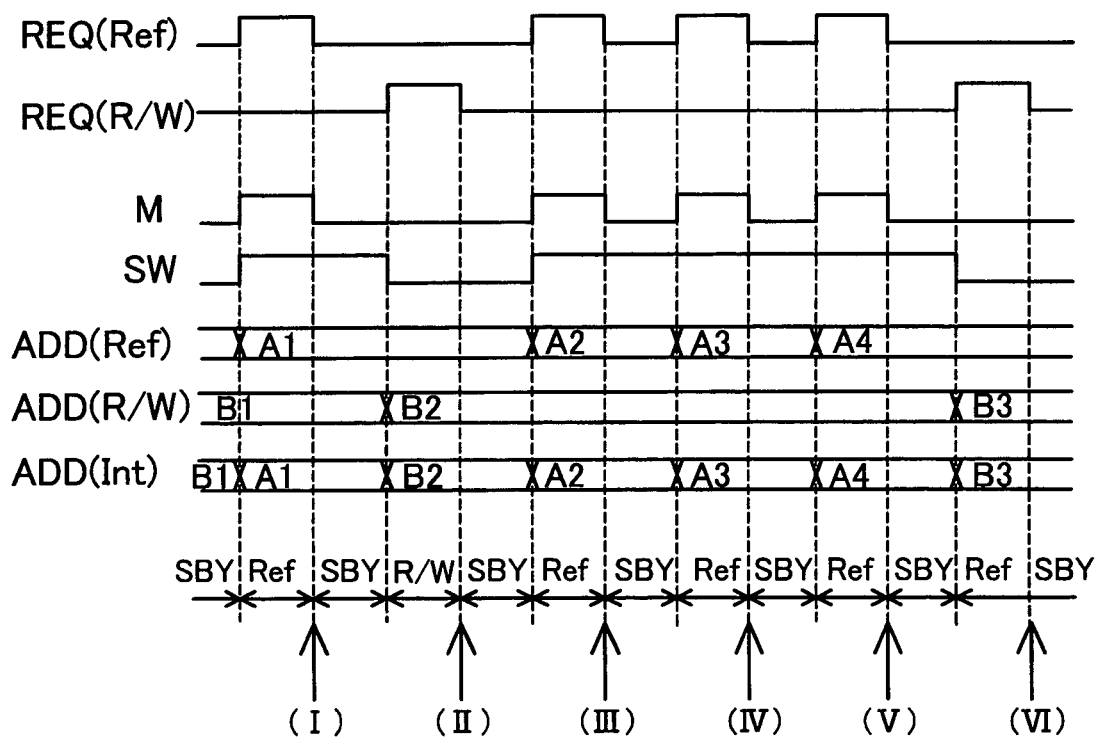
FIG. 8 shows operational waveforms expressing the operation of the semiconductor memory device of the second embodiment.

FIG. 8 shows a specific example of address path switching. The operation period R/W of the ordinary data-input/output mode and the operation period Ref of the refresh mode exist at both sides of the stand-by period SBY, and the operation cycle is constituted by the combination of the operation period R/W or Ref, and the stand-by period SBY.

Now, it is assumed that the refresh mode Ref is selected in a next operation cycle from the operation cycle in which the normal data-input/output mode R/W is set. Since the operation mode is changed to the refresh mode Ref, the refresh operation requesting signal REQ (Ref) is inputted to the mode discriminating circuit 11, and the mode discriminating signal M is inverted to the high logical level. The flip-flop circuit of the switch holding circuit 12 is set by the input of the mode discriminating signal M of the high logical level, and the switch change-over signal SW of the high logical level is outputted. The connection of the address switching circuit 13 is switched to the refresh address ADD (Ref) by the switch change-over signal SW, and the internal address ADD (Int) is switched from an address value B1 to an address value A1 of the refresh address ADD (Ref).

When the operation period Ref of the refresh mode is ended, in the mode discriminating circuit 11, the refresh operation requesting signal REQ (Ref) is inverted to the low level, the flip-flop circuit is reset by the inversion delay signal of the mode discriminating signal M from the inverter delay circuit, and the mode discriminating signal M is inverted to the low level. However, also thereafter, since the switch change-over signal SW maintains the same logical level in the switch holding circuit 12, the connection state of the address switching circuit 13 is maintained even when the operation period Ref of the refresh mode is ended and the stand-by period SBY takes place, and the address value A1 is maintained (in FIG. 8, (I)).

In the next operation cycle, the ordinary data-input/output mode R/W is set. After the operation period Ref in the former operation cycle is ended, the mode discriminating signal M is already inverted to the low logical level. Thus, the flip-flop circuit of the switch holding circuit 12 is reset by the inversion of the data-input/output requesting signal REQ (R/W) to the high logical level, and the switch change-over signal SW is inverted to the low logical level. By this, the connection of the address switching circuit 13 is switched from the refresh address ADD (Ref) to the external address ADD (R/W), and the internal address ADD (Int) is switched from the address value A1 to an address value B2 of the external address ADD (R/W).

When the operation period R/W of the ordinary data-input/output mode is ended, the data-input/output requesting signal REQ (R/W) is inverted to the low level, however, the logical level of the mode discriminating signal M is not changed and maintains the low level. Although the reset signal is ended in the switch holding circuit 12, since the mode discriminating signal M as the set signal also maintains the low logical level, the switch change-over signal SW maintains the same logical level, the connection state of the address switching circuit 13 is maintained even if the operation period R/W of the ordinary data-input/output mode is ended and the stand-by period SBY takes place, and the address value B2 is maintained (in FIG. 8, (II)).

In the subsequent three operation cycles, the refresh mode continues. The refresh operation requesting signal REQ (Ref) is inputted to the mode discriminating circuit 11 at every operation cycle, and the mode discriminating signal M is set at the high logical level, and is inverted to the low logical level each time the operation period Ref of the refresh mode is ended and the stand-by period SBY takes place. In the switch holding circuit 12, the mode discriminating signal M is inputted as the set signal at every operation cycle. However, since the data-input/output requesting signal REQ (R/W) maintains the low level during this, after the flip-flop circuit is set in the first operation cycle, this state including the stand-by period SBY is maintained. Accordingly, after the switch change-over signal SW is inverted to the high logical level at the first operation cycle, it continues to maintain the high logical level in the three continuous cycles. In the address switching circuit 13, the state in which the internal address ADD (Int) is connected to the refresh address ADD (Ref) is maintained, and address values are maintained at address values A2, A3 and A4 even in the stand-by period SBY of the respective operation cycles (in FIG. 8, (III to V)).

In the subsequent operation cycle, when the ordinary data-input/output mode is again set, the data-input/output requesting signal REQ (R/W) is inverted to the high logical level, and the switch change-over signal SW is inverted to the low logical level. The connection of the address switching circuit 13 is switched from the refresh address ADD (Ref) to the external address ADD (R/W), and the internal address ADD (Int) is switched from the address value A4 to B3. Even if the operation period R/W is ended, the switch change-over signal maintains the same logical level, the connection state of the address switching circuit 13 is maintained even when the operation period R/W of the ordinary data-input/output mode is ended and the stand-by period SPY takes place, and the address value B3 is maintained (in FIG. 8, (VI)).

Like the mode discriminating circuit 11, in the setting in which the mode discriminating circuit M of the ordinary data-input/output mode is outputted in the state other than the refresh mode, also in the background art, the address connection is not switched at the time of transition from the operation period R/W of the ordinary data-input/output mode to the stand-by period SBY. However, since the specific example 10 of the first embodiment is provided with the switch holding circuit 12, in addition to this, also at the time of transition from the operation period Ref of the refresh mode to the stand-by period SBY, the address connection is not switched. Accordingly, the address switching after the end of the operation period Ref in the refresh mode, which is switched in the background art, is greatly reduced. This greatly reduces the switching frequency of address bits on the address path from the internal address ADD (Int) to the memory cell, and greatly reduces circuit operations resulting from the switching. Besides, the output itself of the switch change-over signal SW for controlling the connection switching of the address switching circuit 13 is also reduced, and the driving current of the switch change-over signal SW in the switch holding circuit 12 is also greatly reduced.

The degree of the reduction in the address bit switching frequency will be described by use of a specific numerical example in one refresh period. It is assumed that the total bit number of the refresh address ADD (Ref) in the refresh mode Ref is 13 bits. Besides, it is assumed that the address value of the external address ADD (R/W) is fixed. First, the total number T0 of bit switching in the background art will be found. A combination bit number TB0 (x) in the case where the logical level of x bits of an address is changed becomes $$TB0\ (x) = {}_{13}C_x = 13!/(x! \times (13-x)!)(\text{bit}).$$

Accordingly, since the total number of switched bits can be found by the total sum TB0 of the respective combination bit numbers TB0 (x) from one bit to 13 bits in the number of switched bits, it becomes

[Expression 1]

$$TB0 = \sum_{x=1}^{13} x \times TB0(x) = 53247\ (\text{bits}).$$

In the refresh mode Ref, since the address connection switched in the stand-by period SBY is again switched when a next operation cycle starts, the total number T0 of switching of the logical level of the address bits becomes $$T0 = TB0 \times 2 = 106494\ (\text{times}).$$

On the other hand, in the specific example 10 of the first embodiment, there does not occur address switching between the operation period Ref of the refresh mode and the stand-by period SBY. The refresh address ADD (Ref) is switched only by an increment operation of the refresh address ADD (Ref) outputted from the refresh address counter 14 as a binary counter. Accordingly, the total number T of bit switching is coincident with the total sum TB of the combination bit number TB(x) in which the logical level of the x bits is changed. Here, the least significant bit is incremented one by one so that the bit change by the address increment in the binary counter is carried out. Accordingly, the combination bit number TB(x) in the case where the logical level of the x bits of the address is changed is coincident with the combination number in the case where the number of digits carried by the increment operation is x.

$$TB(x) = 2^{13-x}\ (\text{bit}).$$

When the case where the refresh address ADD (Ref) is returned from a state where all are one to a state where all are zero is added to this, the total sum TB of the combination bit number TB(x), that is, the total number T of bit switching becomes

[Expression 2]

$$T = TB = 13 \times 1 + \sum_{x=1}^{13} x \times TB(x) = 16382\ (\text{bits})\ (\text{times}).$$

Accordingly, at the time of the stand-by after the refresh operation is carried out in the pseudo-SRAM or the like, the total number of address bits switched in one refresh period becomes, as compared with the case of the background art, $$16328/106494 \approx 0.15,$$

and is reduced to approximately 15%. In the DRAM such as the pseudo-SRAM, since the ratio of the consumed electric current at the time of refresh operation to the stand-by current is approximately 50%, when the specific example 10 of the first embodiment is applied, it becomes $$0.5 \times (1 - 0.15) = 0.425,$$

and the consumed electric current at the time of the stand-by can be reduced to approximately a half.

According to the semiconductor memory device 10 of the second embodiment as described above, in accordance with the discrimination between the data-input/output mode R/W and the refresh mode Ref, and the mode discriminating signal M indicating which operation mode occurs, the switch change-over signal SW is outputted not in the stand-by period SBY before the start of the operation cycle, but in the operation period Ref or R/W subsequent to the start of the operation cycle. Thus, there does not occur such a state where the connection of the address switching circuit 13 is switched before the operation cycle, and the connection is further returned to the origin at the time of the start of the subsequent operation cycle or at the timing thereafter, and the address supply path is set in accordance with the mode discriminating signal M and the data-input/output requesting signal REQ (R/W), and the suitable address is connected to the next stage decoding circuit 15.

Besides, the switch change-over signal SW corresponding to the operation mode in the former operation cycle is maintained as long as the operation mode is not changed. Thus, one of the external address ADD (R/W) and the refresh address ADD (Ref) is propagated to the internal address ADD (Int), and the input to the decoding circuit 15 does not become uncertain. Besides, the switch change-over signal SW is not outputted until the operation mode between the operation cycles is changed and the connection at the address switching circuit 13 is changed, and the switching of the address supply path can be made minimum.

From the above, an unnecessary switch change-over signal SW is not outputted, and the address switch circuit 13 can be controlled by the output of the required minimum switch change-over signal SW. Accordingly, the unnecessary driving current of the switch change-over signal SW can be reduced. Besides, since the switching of the external address ADD (R/W) and the refresh address ADD (Ref) is carried out in the address switching circuit 13, the unnecessary switching of the address is not propagated to the internal address ADD (Int). Thus, it is possible to prevent unnecessary circuit operations in respective circuits from the next stage decoding circuit 15 to the access of the memory cell array 16. The output of the unnecessary switch change-over signal SW at every operation cycle, and the unnecessary switching resulting from that are prevented from occurring, and the electric current consumption can be suppressed to be minimum.

Figure 9:
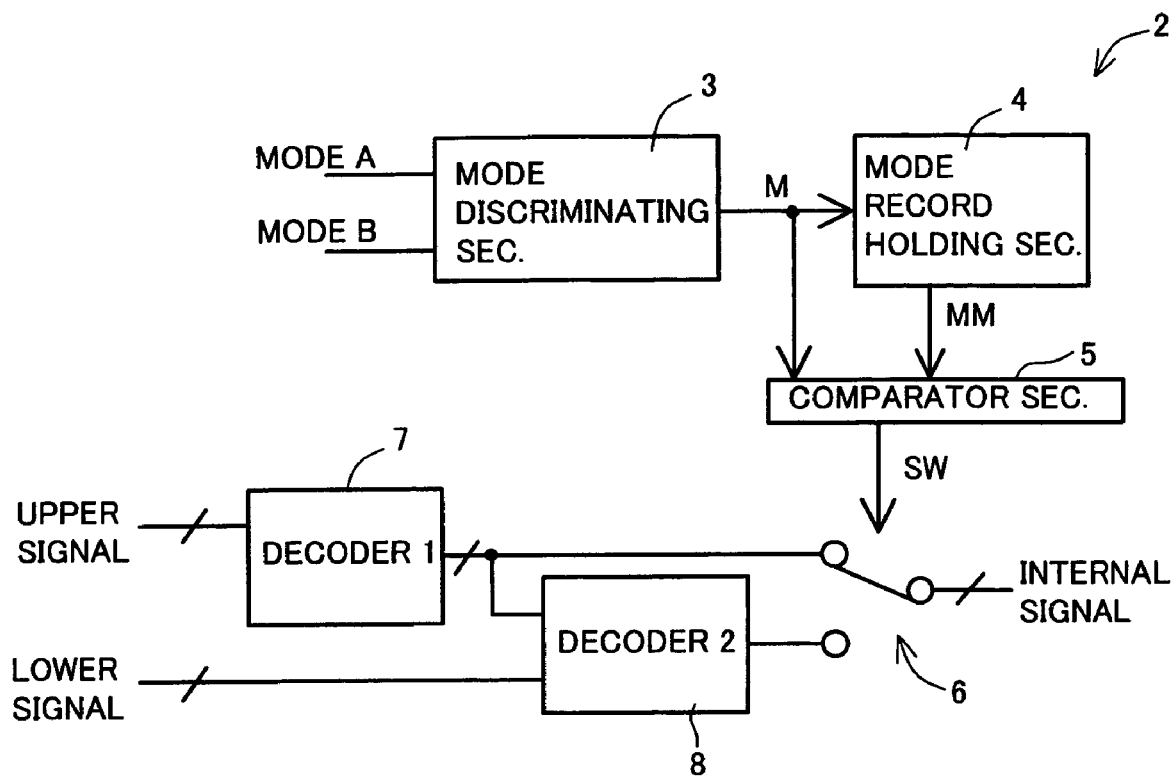
FIG. 9 is a block diagram showing a system configuration diagram for realizing a control method of a third embodiment.

In a system configuration diagram 2 for realizing a control method of a third embodiment shown in FIG. 9, in addition to the system configuration diagram 1 of the first embodiment, there are provided a decoder 1(7) for decoding an upper signal, and a decoder 2(8) for further decoding the output signal of the decoder 1(7) added with a lower signal. The output signals of the decoder 1(7) and the decoder 2(8) are inputted to a switch section 6.

Incidentally, in the description here, structural elements having the same function and the same operation and effect as the structural elements in the system configuration diagram 1 of the first embodiment are designated by the same symbols, and the description here is omitted.

In the system configuration diagram 2, a decode width of an input signal propagated to an internal signal varies in every operation mode. For example, in a mode A, the output signal of the decoder 1(7) for decoding only the upper signal is propagated to the internal signal, and in a mode B, the output signal of the decoder 2(8) for decoding signals from the upper signal to the lower signal is propagated to the internal signal. In the respective operation modes, in the case where mode discriminating signals M and MM are different from each other, a switch change-over signal SW is outputted, and the switch section 6 is switched. The terminal of the output signal of the decoder (7 or 8) adapted to the selected operation mode (mode A or B) is connected to the terminal of the internal signal. Besides, in the case where the operation modes are equal to each other as a result of comparison, the switch change-over signal SW is not outputted, and the connection state of the switch section 6 maintains the state of the former operation cycle.

The system configuration diagram 2 of the third embodiment as described above has the same operation and effect as the system configuration diagram 1 of the first embodiment. Here, even if the switch change-over signal SW is not outputted, the switch section 6 always connects the terminal of the output signal of one of the decoder 1(7) and the decoder 2(8), instead of the input signal A or B in the system configuration diagram 1 of the first embodiment, to the terminal of the internal signal, and the internal signal does not become uncertain.

Figure 10:
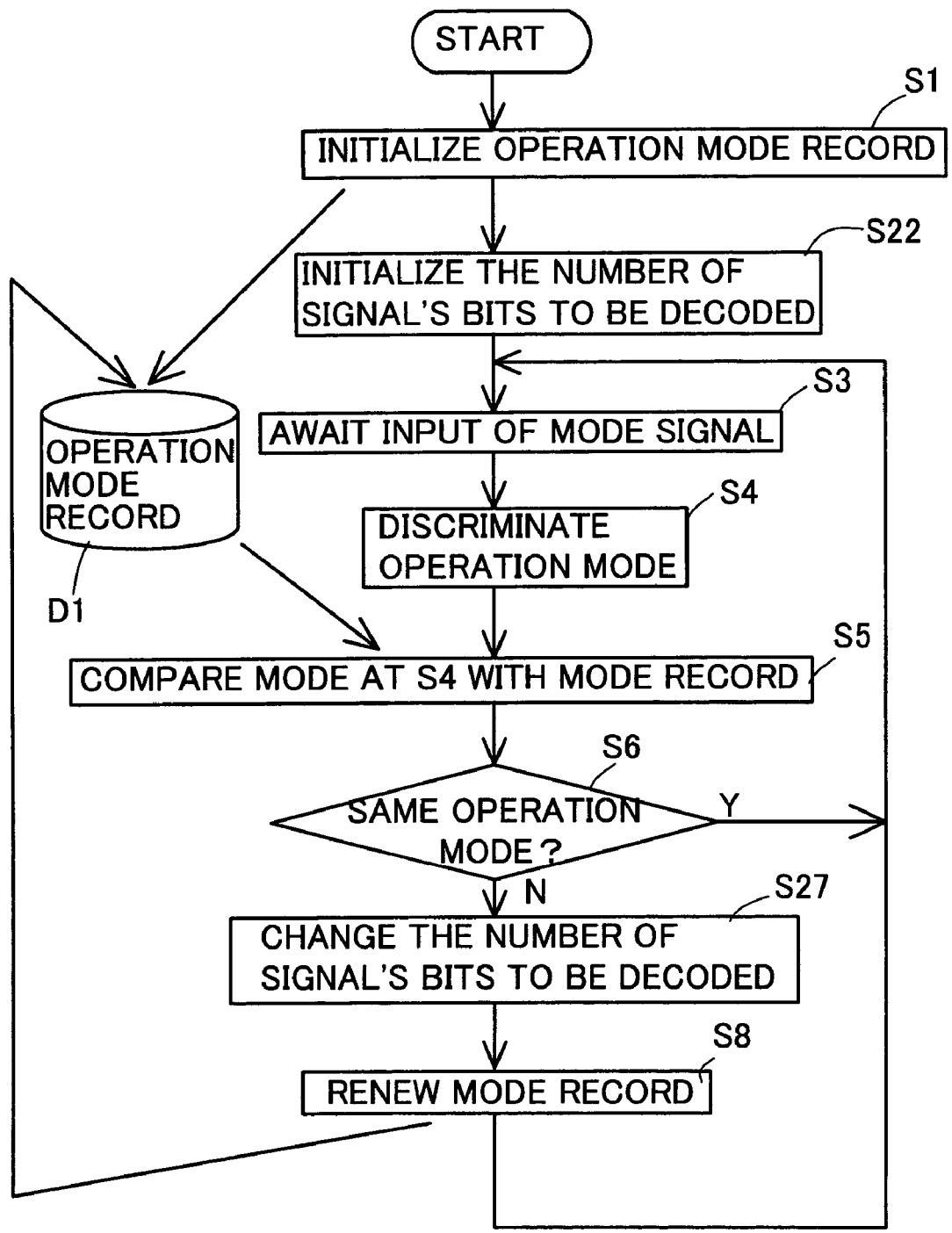
FIG. 10 is a flowchart showing the control method of the third embodiment.

Next, a flowchart of FIG. 10 will be described. FIG. 10 shows the flowchart as to the control method of the third embodiment. The same steps as those of the flowchart concerning the control method of the first embodiment are designated by the same step numbers, and the description here is omitted. In FIG. 10, instead of S2 and S7 in the flowchart (FIG. 3) of the first embodiment, steps of S22 and S27 are included. At the step S22, the bit number of a signal to be decoded is initialized in accordance with the initialization of an operation mode record. Besides, at the step S27, when the operation mode corresponding to the input is not coincident with the operation mode record, the bit number of a signal to be decoded is changed.

The control method of the third embodiment as described above has the same operation and effect as the control method of the first embodiment. Here, the control of the bit number of the signal to be decoded is such that for example, in a signal composed of a plurality of bits, a decoded bit number is switched, and the decode result is propagated to the internal signal. The unnecessary switching control is not carried out, and switching of the decoding signal to the internal signal can be carried out by the required minimum control.

Figure 11:
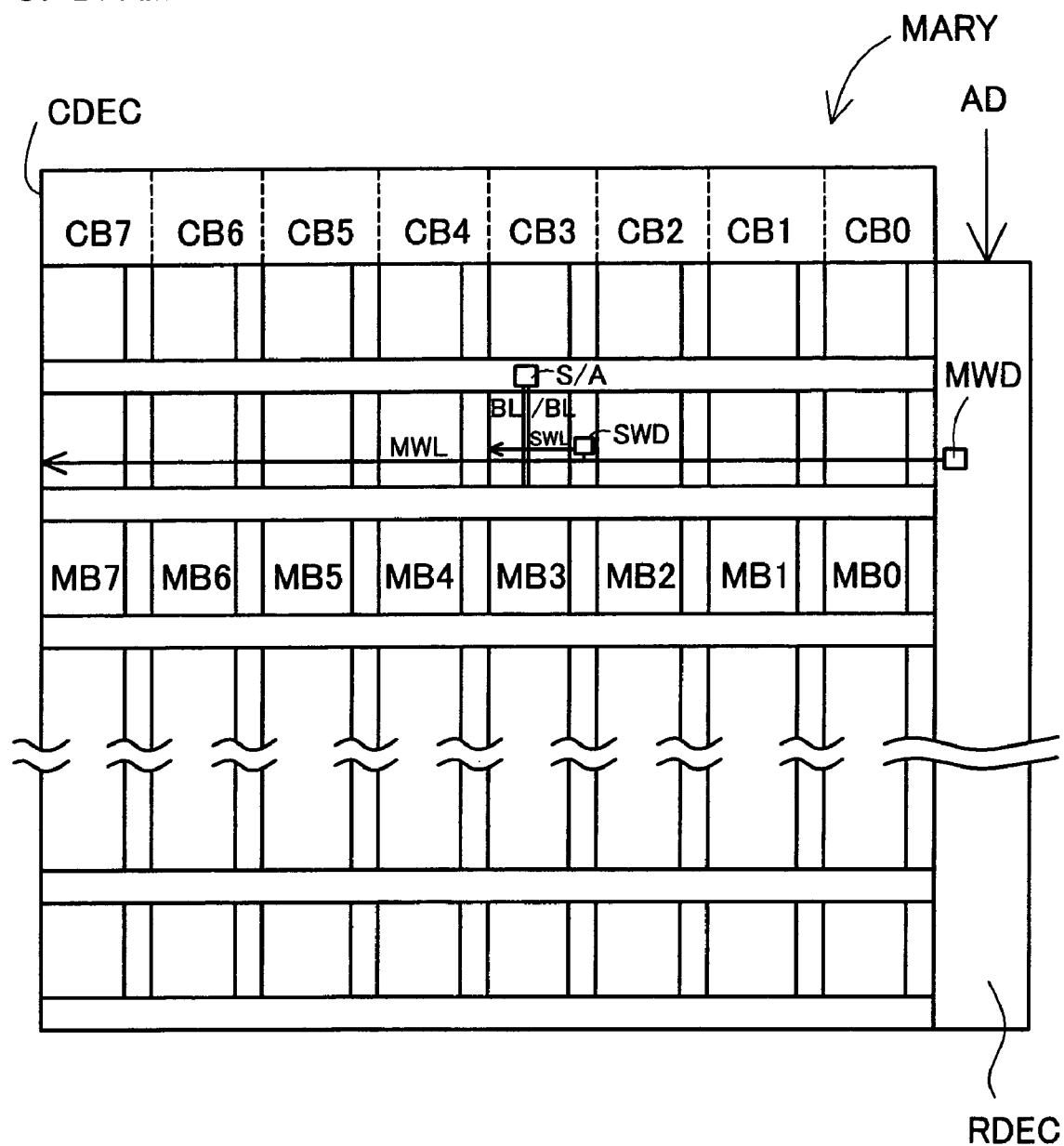
FIG. 11 is a layout block diagram showing a memory array structure of a DRAM.
Figure 12:
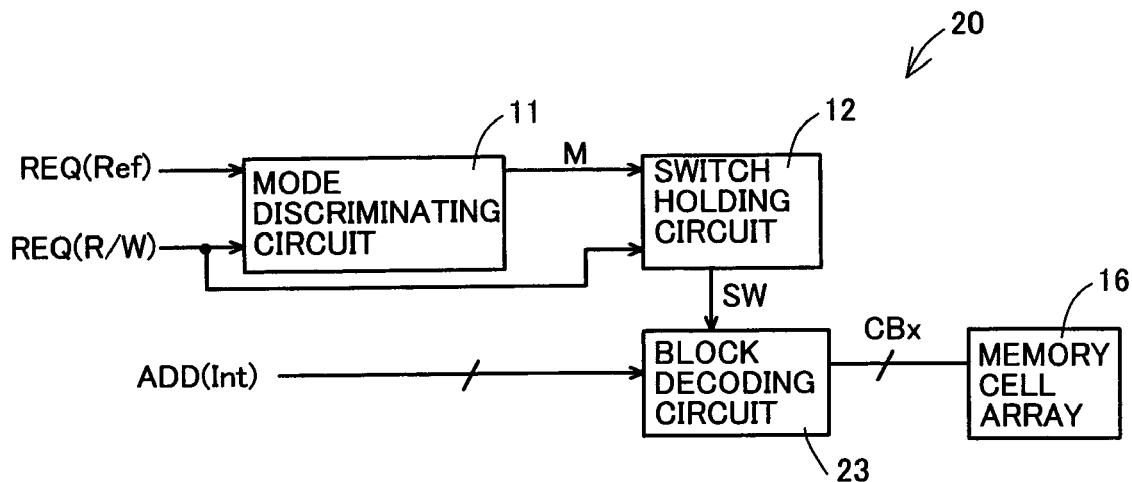
FIG. 12 is a block diagram showing a semiconductor memory device of a fourth embodiment.

Here, before a description of a case where a semiconductor memory device 20 of a fourth embodiment in FIG. 12 is applied to a pseudo-SRAM as a DRAM having a built-in refresh operation, a memory cell array MARY structure of the pseudo-SRAM will be described with reference to FIG. 11. The memory cell array MARY in which memory cells are arranged in a matrix form is divided in a row direction and a column direction with a predetermined length and is constituted by, as one unit, a memory cell block MBx. In the row direction, the control is carried out by a row decoder RDEC to which the decoding signal AD decoded by the decoding circuit 15 is inputted, and in the column direction, the control is carried out by a column decoder CDEC. By these controls, the memory cell block MBx is selected. Specifically, a main word line MWL is selected by a main word driver MWD in the row decoder RDEC. Besides, by a block selecting signal CBx (x=0 to 7) outputted from the column decoder CDEC, a position of the memory cell block MBx activated in the column direction is selected. By a sub-word driver SWD arranged at the column position selected by this block selecting signal CBx (X=0 to 7), a sub-word line SWL is activated on the basis of the activation signal from the main word line MWL. Memory cell information is read out to a bit line BL or /BL, and is amplified by a sense amplifier S/A.

In the ordinary data-input/output mode R/W, from the request for reduction in consumed electric current at the time of operation, it is preferable that the number of memory cell blocks MBx selected for access is set to be small. On the other hand, in the refresh mode Ref, it is necessary to satisfy the specification of a refresh period determined from the limitation of an electric charge holding time in the memory cell, and therefore, it is necessary to refresh a certain number of memory cells. From a recent tendency towards the enlargement of capacity, there is a tendency that the number of memory cells to be refreshed at the same time is increased. Accordingly, it is necessary that the number of memory cell blocks MBx to be activated at the same time is made large as compared with the number in the ordinary data-input/output mode R/W. For example, in FIG. 11, in the case of the ordinary data-input/output mode R/W, a block selecting signal CB0 is selected to select a memory cell block MB0. On the other hand, in the refresh mode Ref, all block selecting signals CBx (x=0 to 7) are selected, so that all memory cell blocks MBx (x=0 to 7) activated by one main word line MWL are selected at the same time. Incidentally, in the refresh mode Ref, it is a condition that the number of memory cell blocks MBx to be selected is large as compared with the ordinary data-input/output mode R/W, and in addition to the case where all memory cell blocks MBx (x=0 to 7) are selected at the same time, such configuration may be adopted that a suitable number of memory cell blocks MBx, not less than two blocks, are selected at the same time.

Next, a description will be given of a case where the semiconductor memory device 20 of the fourth embodiment is applied to the pseudo-SRAM as the DRAM having the built-in refresh operation. Instead of the address switching circuit 13 in the semiconductor memory device 10 of the second embodiment, a block decoding circuit 23 is provided and is controlled by a switch change-over signal SW. Besides, the input of the block decoding circuit 23 is an internal address ADD (Int) which is decoded in the block decoding circuit 23, and an output block selecting signal CBx is outputted to a memory cell array 16. Incidentally, a mode discriminating circuit 11 and a switch holding circuit 12 are the same as the structure in the semiconductor memory device 10 of the second embodiment, and the description here is omitted.

In the semiconductor memory device 20 of the fourth embodiment, the switch change-over signal SW is outputted only in a case where the operation mode is changed, and the number of bits to be decoded is changed in the internal address ADD (Int) inputted to the block decoding circuit 23. For example, in the case where any one of the memory cell blocks MBx is selected in the ordinary data-input/output mode R/W, or all memory cell blocks MBx (x=0 to 7) are selected in the refresh mode Ref at the same time, the internal address ADD (Int) of a predetermined bit number is inputted to the block decoding circuit 23 in the ordinary data-input/output mode R/W, whereas all bits constituting the internal address ADD (Int) become "don't care" in the refresh mode Ref, and decoding in the block decoding circuit is not carried out. In addition to this, as compared with the ordinary data-input/output mode R/W, if a less bit number is selected from the upper address and decoding is carried out in the refresh mode Ref, more block selecting signals CBx can be selected, and the block selecting signals CBx corresponding to the operation mode are outputted.

Figure 13:
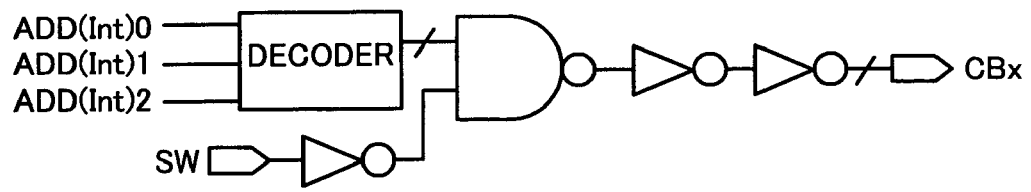
FIG. 13 is a circuit diagram showing a block decoding circuit in the semiconductor memory device of the fourth embodiment.

FIG. 13 shows a specific example of the block decoding circuit 23. As a matter of convenience, there is shown a case in which internal addresses ADD (Int) 0 to 2 of three bits are inputted. An output signal of a decoder for decoding the internal addresses ADD (Int) 0 to 2 is inputted to one input terminal of a NAND gate, and the switch change-over signal SW is inputted to the other input terminal through an inverter gate. An output signal of the NAND gate is outputted as the block selecting signal CBx through a two-stage inverter gate. In the ordinary data-input/output mode R/W, since the switch change-over signal SW is at the low logical level, when the output signal of the decoder comes to have the high logical level, the block selecting signal CBx is outputted as the high logical level, and selects the memory cell block in the memory cell array for inputting/outputting data. On the other hand, in the refresh mode Ref, since the switch change-over signal SW is at the high logical level, irrespective of the output signal of the decoder, all block selecting signals CBx come to have the high logical level, and all memory cell blocks are selected.

Figure 14:
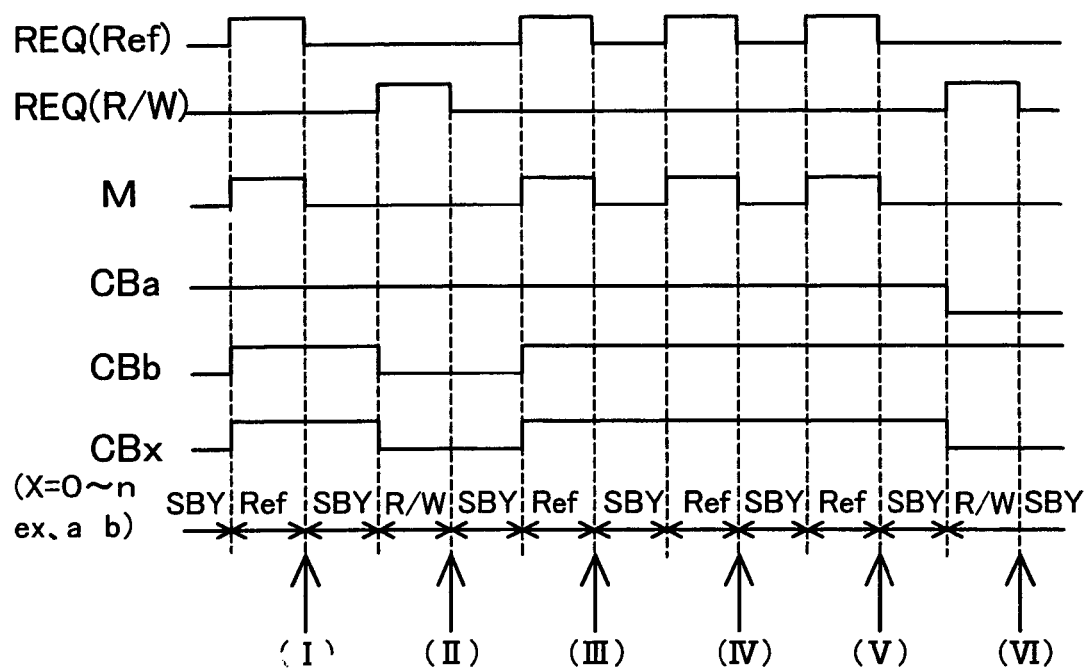
FIG. 14 shows operational waveforms expressing the operation in the semiconductor memory device of the fourth embodiment.
Figure 15:
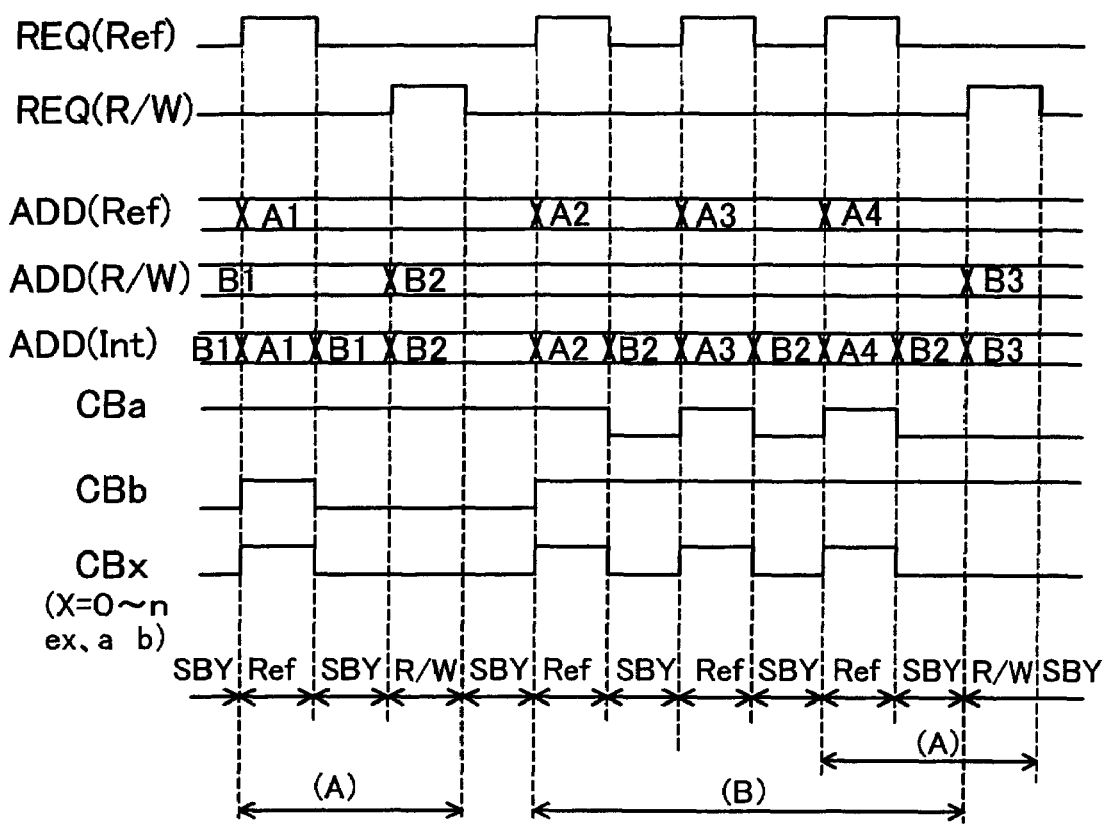
FIG. 15 shows conventional operational waveforms expressing a conventional operation.

A specific switching example of the block selecting signal CBx shown in FIG. 14 has the same sequence as the switching example (FIG. 8) of the address path in the semiconductor memory device 10 of the second embodiment, and is controlled by the same switch change-over signal SW. In the example of FIG. 13, a block selecting signal CBa is selected in the first data-input/output mode R/W, and a block selecting signal CBb is selected in the next data-input/output mode R/W. On the other hand, in the refresh mode Ref, all block selecting signals CBx (x=0 to n) are selected.

Similarly to the case (FIG. 8) of the semiconductor memory device 10 of the second embodiment, since the setting is such that the mode discriminating signal M of the ordinary data-input/output mode R/W is outputted in a state other than the refresh mode Ref, the block selecting signal CBx is not switched at the time of transition from the operation period R/W of the ordinary data-input/output mode to the stand-by period SBY (in FIG. 13, (II), (VI)), and further, the block selecting signal CBx is not switched also at the time of transition from the operation period Ref of the refresh mode to the stand-by period SBY (in FIG. 13, (I), (III) to (V)). Accordingly, switching of the block selecting signal CBx after the end of the operation period Ref of the refresh mode, which is switched in the background art, is greatly reduced, and a driving current of the block decoding circuit 23 by signal transition of the block selecting signal CBx can also be greatly reduced.

According to the semiconductor memory device 20 of the fourth embodiment as described above, since the switch change-over signal SW is outputted in accordance with the operation mode not in the stand-by period SBY before the start of the operation cycle, but in the operation period Ref or R/W subsequent to the start of the operation cycle, there does not occur such a state that the bit number of the address connected to the block decoding circuit 23 is switched before the operation cycle, and the block selecting signal CBx is changed and the memory cell block MBx to be accessed is switched, and is further returned to the origin at the time of the start of the subsequent operation cycle or at the timing thereafter. In accordance with the judgment result, the switching control signal is outputted by the required minimum electric current consumption, the decoding bit number of the address according to the access mode is set, and the suitable memory cell array block MBx is selected.

Here, the bit number is a bit number from a high order bit in address to a predetermined low order bit position, and by suitably setting the predetermined low order bit position, the size of the address region set by the address to be decoded can be suitably set.

Besides, as long as the operation mode is not changed, the switch change-over signal SW according to the operation mode in the former operation cycle is maintained. Thus, the bit number of the address connected to the block decoding circuit 23 is set to any one of the bit numbers different for every operation mode, and the predetermined block selecting signal CBx is outputted, and the memory cell block MBx to be accessed does not become uncertain. Besides, the switch change-over signal SW is not outputted until the operation mode between the operation cycles is changed and the bit number of the address to the block decoding circuit 23 is changed.

From the above, an unnecessary switch change-over signal SW is not outputted, and the block decoding circuit 23 can be controlled by the output of the required minimum switch change-over signal SW. Besides, the bit number of the address connected to the block decoding circuit 23 is switched, the block selecting signal CBx is changed, and the memory cell array block MBx to be accessed is set, so that the memory cell array block MBx is not unnecessarily switched. Thus, unnecessary circuit operations in respective circuits leading to the memory cell can be prevented. Besides, unnecessary driving of the block selecting signal CBx from the block decoding circuit 23 can be reduced. Accordingly, the output of the unnecessary switch change-over signal SW at every operation cycle, and the unnecessary switching of the block selecting signal CBx resulting from that are prevented from occurring, and the current consumption can be suppressed to be minimum.

Besides, the predetermined low order bit position is a lower order bit position in the data input/output mode as compared with a bit position in the refresh mode, so that an address region set in the refresh mode can be made wider, and an address region set in the data-input/output mode can be made narrower.

By applying the semiconductor memory devices 10 and 20 of the second and fourth embodiments as described above in combination, in the DRAM such as the pseudo-SRAM, the ratio of the consumed electric current at the time of the refresh operation to the stand-by current can be reduced to approximately a half or less as compared with the case of the background art.

Further, in the first and second embodiments, at the time of the start of the operation cycle or a subsequent suitable timing, the operation mode is compared with the operation mode of the former operation cycle, and a suitable switching-procedure instruction is given in accordance with the result. There is no unnecessary switching-procedure instruction, and the switching control can be carried out by the required minimum switching-procedure instruction.

Besides, since the switching-procedure instruction is given only in the case where the comparison results are inconsistent, the unnecessary switching-procedure instruction can be suppressed.

Besides, in the case where the same operation mode is set in a plurality of continuous operation cycles, since the switching-procedure instruction is given only at the first operation cycle in the plurality of operation cycles, after the switching procedure is completed at the first operation cycle, the unnecessary switching-procedure instruction can be suppressed.

Here, the switching-procedure instruction is the output of a control signal for setting the internal state in accordance with the operation mode.

Besides, the internal state is a supply method of the internal signal or a decode state of the internal signal, and the switching of the internal state is the switching of the internal signal supply source of the internal signal, or the switching of the bit number of the internal signal decoded in the decode state. By this, the instruction of the unnecessary switching control procedure is not given, and the switching of the supply source of the internal signal or the switching of the bit number of the internal signal to be decoded can be carried out by the required minimum instruction.

Incidentally, it is needless to say that the invention is not limited to the foregoing embodiments, but various improvements and modifications can be carried out within the range not departing from the gist of the invention.

For example, in the embodiments, the description has been mainly given of the semiconductor memory device, the system configuration diagrams 1 and 2 in the first and third embodiments are the embodiments including the semiconductor memory device, and the control methods in the first and third embodiments are the embodiments including the control method of the semiconductor memory device. However, the invention is not limited to this, but can be similarly applied to a system other than the semiconductor memory device and the control method thereof, as long as the system includes a plurality of operation modes having different internal states, and the operation mode is switched at every operation cycle.

According to the invention, it becomes possible to provide the semiconductor memory device which has a plurality of operation modes and can reduce a consumed electric current by carrying out the switching control of an internal signal required for every operation mode by the required minimum control.

What is claimed is:

1. A semiconductor memory device having a data-input/output mode and a refresh mode as an access operation to a memory cell, comprising:
    a mode discriminating circuit for discriminating between the data-input/output mode and the refresh mode at every operation cycle constituted by, as one unit, an operation period for carrying out the access operation and a stand-by period from an end of the operation period to a start of a next operation period;
    a switching control circuit for outputting a switching control signal in the operation period after a start of the operation cycle only in a case where an operation mode discriminated by the mode discriminating circuit is different from an operation mode in the former operation cycle; and
    an address switching circuit for switching a connection to a decoding circuit at every output of the switching control signal, while one of external address used in the data-input/output mode and a refresh address from a refresh address counter used in the refresh mode is always connected to the decoding circuit.

2. A semiconductor memory device having a data-input/output mode and a refresh mode as an access operation to a memory cell, comprising:
    a mode discriminating circuit for discriminating between the data-input/output mode and the refresh mode at every operation cycle constituted by, as one unit, an operation period for carrying out the access operation and a stand-by period from an end of the operation period to a start of a next operation period;

a switching control circuit for outputting a switching control signal in the operation period after a start of the operation cycle only in a case where the operation mode discriminated by the mode discriminating circuit is different from the operation mode in the former operation cycle; and a block decoding circuit in which when a memory cell array block to be accessed is specified, either a first number of bits with respect to address decoded in the data-input/output mode or a second number of bits with respect to address decoded in the refresh mode, smaller than the first number of bits is always connected, and connection is switched at every output of the switching control signal alternately between the first number and the second number.

* * * * *